(12) United States Patent
Chou et al.

(10) Patent No.: US 8,240,363 B2
(45) Date of Patent: Aug. 14, 2012

(54) HEAT DISSIPATION APPARATUS

(75) Inventors: Chia-Shin Chou, Taipei Hsien (TW);
Zhen-Xing Ye, Shenzhen (CN);
Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 539 days.

(21) Appl. No.: 12/468,825

(22) Filed: May 19, 2009

(65) Prior Publication Data
US 2010/0246126 A1   Sep. 30, 2010

(30) Foreign Application Priority Data

Mar. 30, 2009 (CN) .......................... 2009 1 0301203

(51) Int. Cl.
*H01L 23/467* (2006.01)
*F28F 7/00* (2006.01)
*H05K 7/20* (2006.01)

(52) U.S. Cl. .................. 165/121; 165/80.3; 361/697
(58) Field of Classification Search .................. 165/185, 165/80.3; 361/704, 710, 679.47
See application file for complete search history.

(56) References Cited

U.S. PATENT DOCUMENTS

| | | | | |
|---|---|---|---|---|
| 6,662,412 | B2* | 12/2003 | Chuang et al. | 24/457 |
| 7,089,999 | B1* | 8/2006 | Wu et al. | 165/80.3 |
| 7,130,192 | B2* | 10/2006 | Wang et al. | 361/697 |
| 2007/0044942 | A1* | 3/2007 | Mou | 165/104.33 |

* cited by examiner

*Primary Examiner* — Ljiljana Ciric
*Assistant Examiner* — Jason Thompson
(74) *Attorney, Agent, or Firm* — Altis Law Group, Inc.

(57) ABSTRACT

A heat dissipation apparatus includes a heat sink, a fan, and a fixing structure. The fan defines a number of fixing holes. The fixing structure includes a base, two resilient side panels bent from two sides of the base. The base and the side panels bound an accommodating space to accommodate the fan. An airflow opening is defined in the base for allowing air to flow between the heat sink and the fan. First ends of a number of fasteners secure the base of the fixing structure to the heat sink. Second ends of the number of fasteners protrude through the base into the accommodating space, to be accommodated in the corresponding fixing holes of the fan.

5 Claims, 3 Drawing Sheets

HEAT DISSIPATION APPARATUS

BACKGROUND

1. Technical Field

The present disclosure relates to heat dissipation apparatuses and, particularly, to a heat dissipation apparatus for a central processing unit (CPU) of a computer system.

2. Description of Related Art

Generally speaking, a heat dissipation apparatus including a heat sink with a conductive plate and a plurality of cooling fins provided on a top of the plate, a supporter secured to a bottom of the heat sink, and a fan attached to a top of the heat sink, is known to be used for cooling heat-generating components such as central processing units (CPUs). The most common fans used for this purpose are fixed on the tops of the heat sinks with screws, which requires tools and so is complex and inconvenient to assemble.

DETAILED DESCRIPTION

Figure 1:
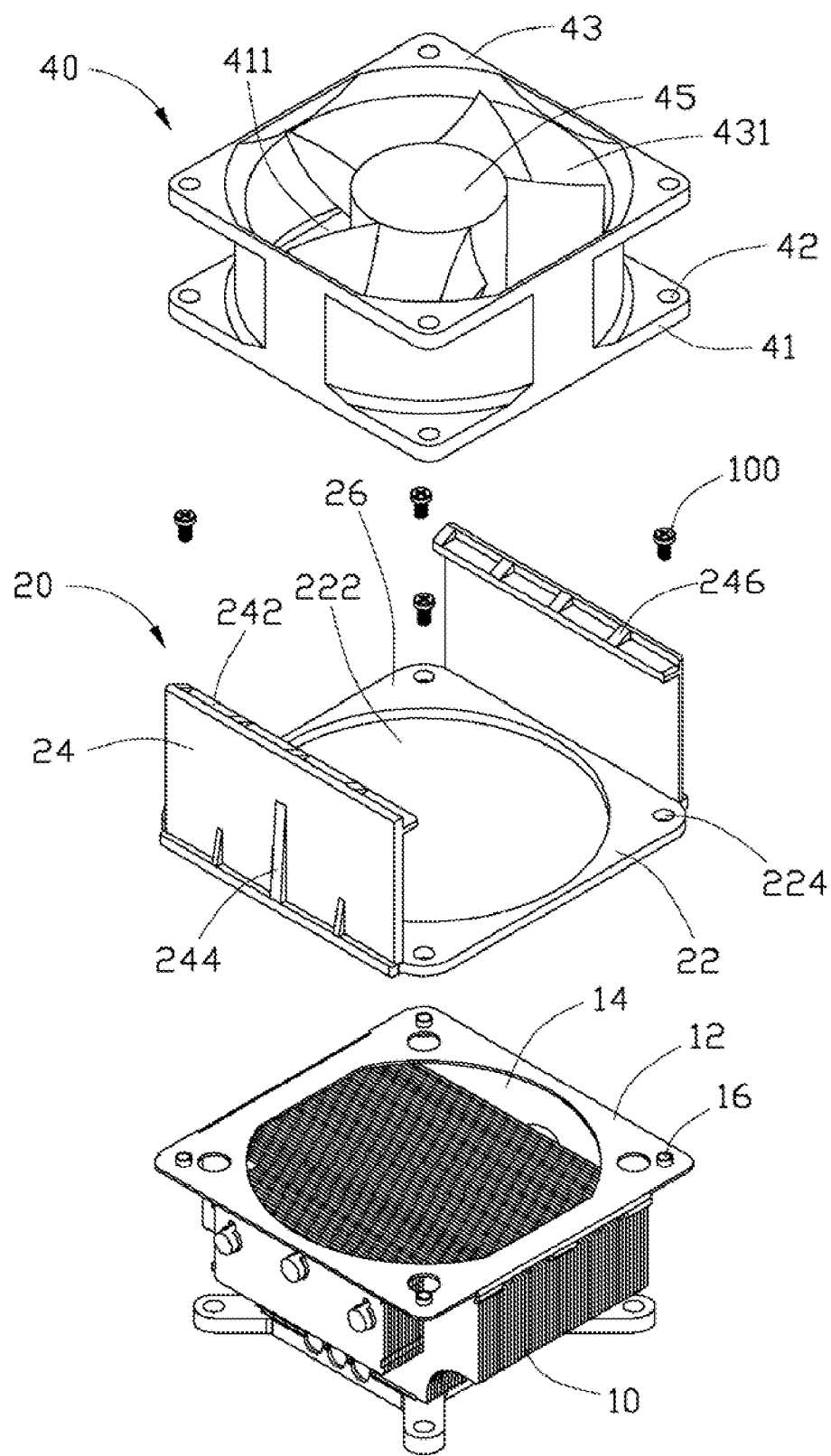
FIG. 1 is an exploded, isometric view of a heat dissipation apparatus including a heat sink, a fan, and a fixing structure, in accordance with an embodiment.

Referring to FIG. 1, an exemplary embodiment of a heat dissipation apparatus for a central processing unit (CPU) includes a heat sink 10 mounted on the CPU to absorb heat from the CPU, a fixing structure 20, and a fan 40. The fan 40 includes a first lateral plate 41 defining an airflow outlet 411, and a second lateral plate 43 defining an airflow inlet 431. The first and second lateral plates 41, 43 are opposite to each other to accommodate an impeller 45 of the fan 40 therein. The heat sink 10 includes a square-shaped support board 12 set on a top of the heat sink 10. An intake 14 is defined in a center of the support board 12. Four locking holes 16 are respectively defined in four corners of the support board 12 surrounding the intake 14.

The fixing structure 20 includes a base 22 and two resilient side panels 24 extend from opposite sides of the base 22 perpendicularly. An accommodating space 26 is defined by the base 22 and the side panels 24 for receiving the fan 40. An airflow opening 222 is defined in a center of the base 22, corresponding to the intake 14 of the support board 12. Four through holes 224 are respectively defined in four corners of the base 22, corresponding to the locking holes 16 of the support board 12. A locking portion 242 projects inward from an upper portion of each side panel 24, and a plurality of first ribs 244 extends from an outer surface of each side panel 24 to the base 22, for reinforcing the side panel 24. A plurality of second ribs 246 is formed from the top of each locking portion 242 to a corresponding side panel 24, to reinforce the locking portion 242.

Four fixing holes 42 are respectively defined in four corners of the first lateral plate 41 of the fan 40, corresponding to the through holes 224 of the fixing structure 20.

Figure 2:
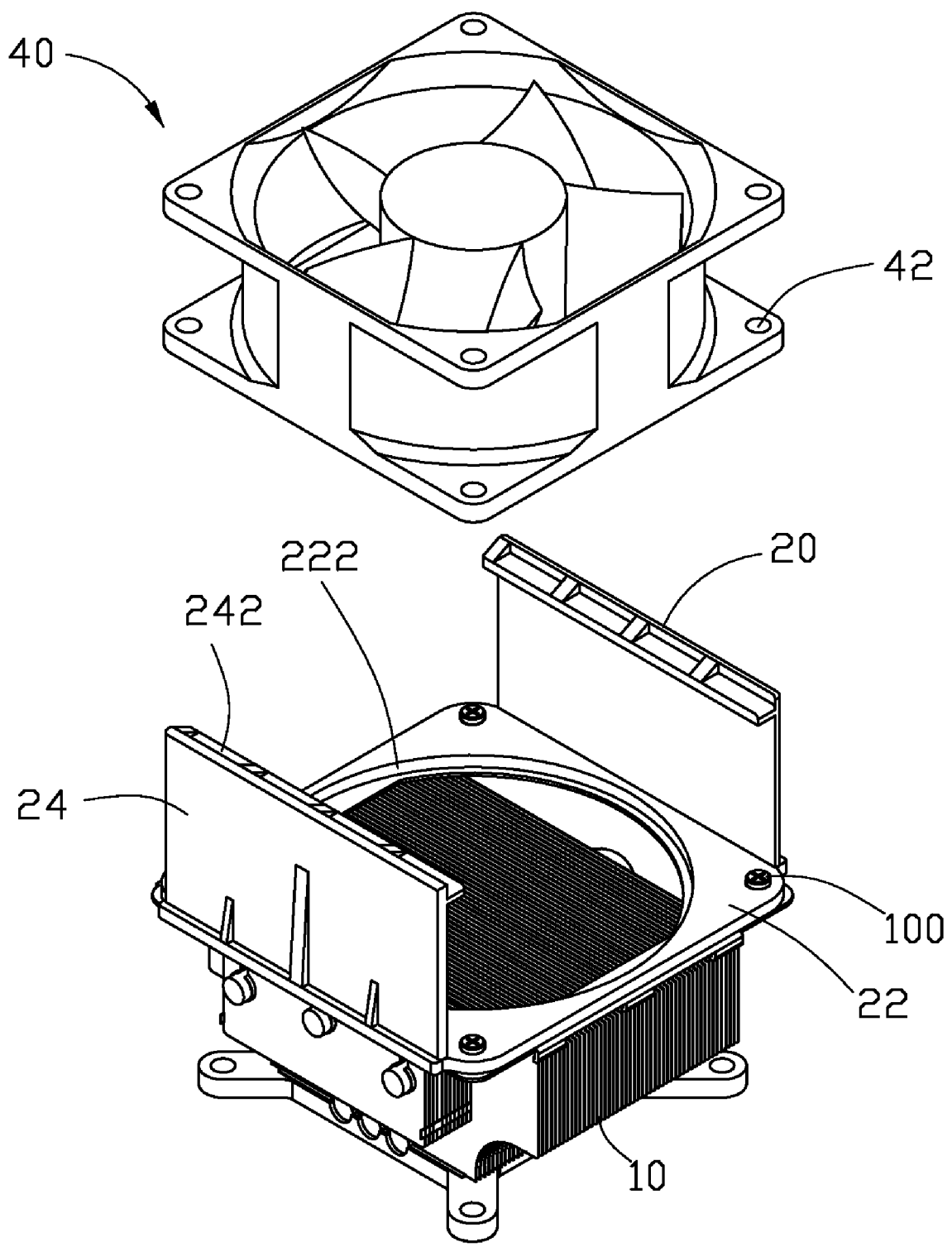
FIG. 2 is a partially assembled view of FIG. 1.
Figure 3:
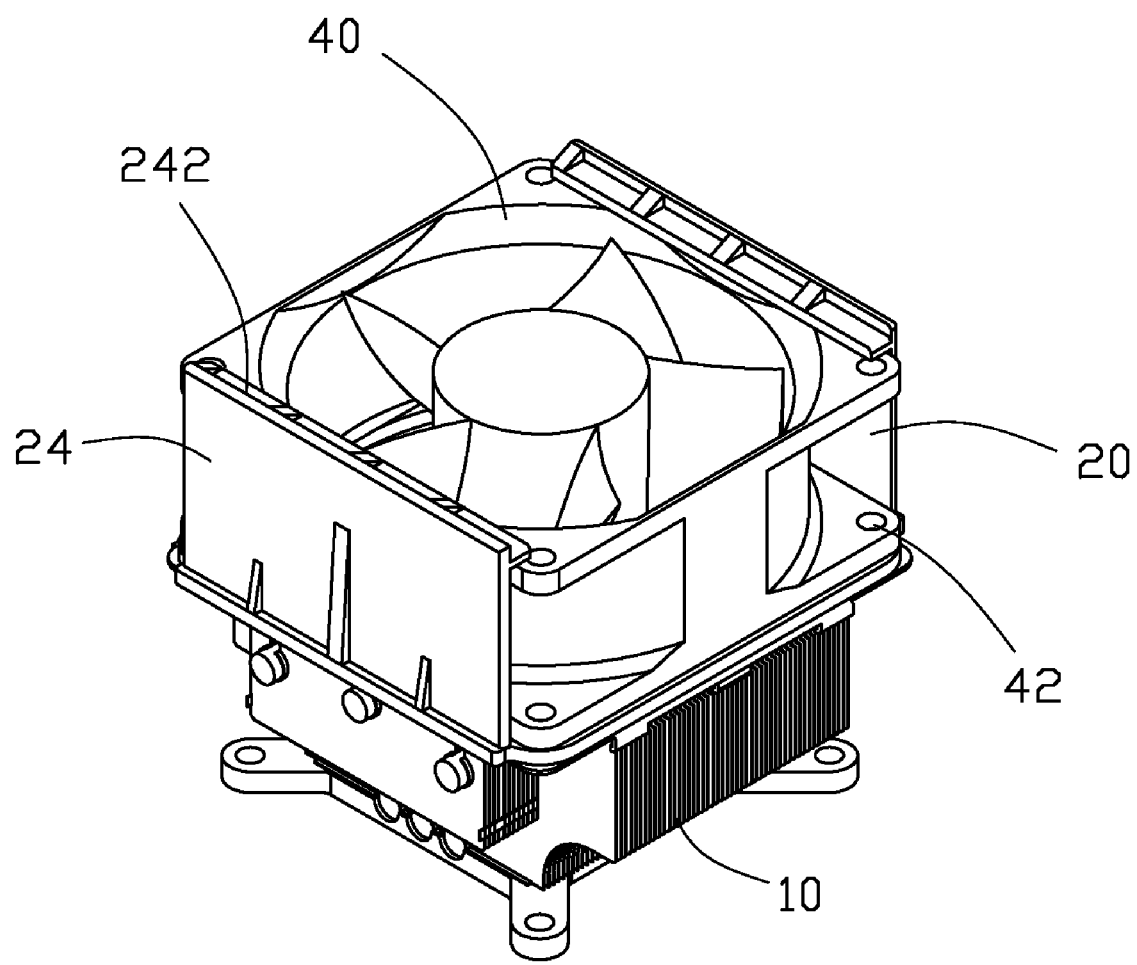
FIG. 3 is an assembled view of FIG. 1.

Referring to FIGS. 2 and 3, in assembly, a plurality of fasteners 100, such as screws, are respectively passed through the through holes 224 of the base 22 of the fixing structure 20 and locked in the corresponding locking holes 16 of the support board 12. Therefore, the fixing structure 20 is fixed on the heat sink 10. The airflow opening 222 of the fixing structure 20 aligns with the intake 14 of the support board 12.

By deforming the side panels 24 away from each other, the fan 40 is placed in the accommodating space 26 of the fixing structure 20, and the heads of the fasteners 100 are respectively accommodated in the corresponding fixing holes 42 of the fan 40 to limit a movement of the fan 40 along the first lateral plate 41. The airflow outlet 411 of the fan 40 aligns with the airflow opening 222 of the base 22. The side panels 24 are then restored toward each other, to sandwich the fan 40 therebetween. The locking portions 242 of the side panels 24 are respectively resiliently resisted against the second lateral plate 43 of the fan 40. Therefore, the fan 40 can be fixed on the heat sink 10 conveniently.

In use, heat absorbed by the heat sink 10 can be removed by fan 40 through the intake 14 of the support board 12 and the airflow opening 222 of the fixing structure 20. In other embodiments, the fan 40 can bring air conditioning to the heat sink 10 through the airflow opening 222 of the fixing structure 20 and the intake 14 of the support board 12.

In disassembling the fan 40 from the heat sink 10, the side panels 24 of the fixing structure 20 are deformed away from each other, with the locking portions 242 of the side panels 24 respectively departing from the top of the fan 40. Therefore, the fan 40 can be conveniently removed from the accommodating space 26 of the fixing structure 20.

In other embodiments, the side panels 24 of the fixing structure 20 can be formed on two neighboring sides of the base 22 perpendicularly, or three side panels 24 can be formed on three sides of the base 22 perpendicularly.

The fan 40 can be placed in the accommodating space 26 of the fixing structure 20 through deforming the side panels 24 of the fixing structure 20. The locking portion 242 are resiliently engaged with the second lateral plate 43 of the fan 40, and the heads of the fasteners 100 are respectively accommodated in the corresponding fixing holes 42 of the fan 40, when the fan 40 is mounted to the fixing structure 20. Therefore, the fan 40 can be easily mounted to or removed from the accommodating space 26 of the fixing structure 20.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternately embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A heat dissipation apparatus comprising:

a heat sink;

a fan comprising a first lateral plate defining an airflow outlet, and a second lateral plate defining an airflow inlet wherein the first and second lateral plates are opposite to each other to sandwich an impeller of the fan therein, and a plurality of fixing holes is defined in the first lateral plate of the fan; and a fixing structure comprising:

a base defining an airflow opening to allow air to flow between the heat sink and the fan; the first lateral plate of the fan rests on the base;

two resilient side panels extending perpendicularly from two sides of the base, wherein the base and the side panels form an accommodating space to accommodate the fan therein; and a locking portion projects inward from each of the side panels, to engage with the second lateral plate of the fan to limit a movement of the fan perpendicular to the first lateral plate; and a plurality of fasteners each with a first end securing the base of the fixing structure to the heat sink, and a second end protruding into the accommodating space; wherein the second end is a bulge head, the first end is a threaded post extending from the bulge head, and the bulge head rests on the base and is accommodated in a corresponding fixing hole of the fan to limit a movement of the fan along a direction parallel with the first lateral plate.

2. The heat dissipation apparatus of claim 1, wherein a plurality of through holes are defined in the base and surrounding the airflow opening, the first ends of the plurality of fasteners respectively pass through the through holes of the base to be engaged in the heat sink.

3. The heat dissipation apparatus of claim 2, wherein the heat sink comprises a support board, an intake is defined in a center of the support board, corresponding to the airflow opening of the base; a plurality of locking holes are defined in the support board surrounding the intake, corresponding to the through holes of the base, the first ends of the plurality of fasteners respectively pass the through holes of the base and are locked in the plurality of locking holes of the support board, for fixing the base on the support board of the heat sink.

4. The heat dissipation apparatus of claim 1, wherein a plurality of ribs extend from an outer surface of each side panel to the base, for reinforcing the side panel.

5. The heat dissipation apparatus of claim 1, wherein a plurality of ribs are formed from a top of each locking portion to the corresponding side panel, for reinforcing the joint between the locking portion and the corresponding side panel.

* * * * *